(12) United States Patent
Campbell

(10) Patent No.: US 9,869,494 B1
(45) Date of Patent: *Jan. 16, 2018

(54) THERMOELECTRIC COOLERS WITH ASYMMETRIC CONDUCTANCE

(71) Applicant: Geoffrey O. Campbell, Broomfield, CO (US)

(72) Inventor: Geoffrey O. Campbell, Broomfield, CO (US)

(73) Assignee: Geoffrey O. Campbell, Broomfield, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/298,524

(22) Filed: Oct. 20, 2016

Related U.S. Application Data

(62) Division of application No. 14/492,577, filed on Sep. 22, 2014, now Pat. No. 9,506,675.

(60) Provisional application No. 61/881,244, filed on Sep. 23, 2013.

(51) Int. Cl.
*F25B 21/04* (2006.01)

(52) U.S. Cl.
CPC .................................. *F25B 21/04* (2013.01)

(58) Field of Classification Search
CPC ...... F25B 21/04; F25B 2321/02; H01L 35/28; H01L 35/30
See application file for complete search history.

(56) References Cited

U.S. PATENT DOCUMENTS

| | | | | |
|---|---|---|---|---|
| 2007/0289620 | A1* | 12/2007 | Stark .................. | H01L 35/32 136/205 |
| 2008/0017237 | A1* | 1/2008 | Bray .................. | H01L 35/26 136/224 |
| 2012/0042661 | A1* | 2/2012 | Danenberg .......... | F25B 21/02 62/3.2 |
| 2012/0192910 | A1* | 8/2012 | Fowler ............... | H01L 35/30 136/206 |

* cited by examiner

*Primary Examiner* — Emmanuel Duke
(74) *Attorney, Agent, or Firm* — Burns & Levinson LLP; Orlando Lopez

(57) ABSTRACT

A TE cooler wherein the conductance between the peak temperature location and the hot side of the TE couple can be increased in a number of ways. The ways to increase the conductance between the peak temperature location and the hot side of the TE couple include one or more of introducing a thermal conductive/electrically insulating material to fill the voids between legs; modifying the leg geometry with a variable cross-section as a function of distance along the leg; and/or using functionally graded TE materials with varying thermal conductivity.

6 Claims, 11 Drawing Sheets

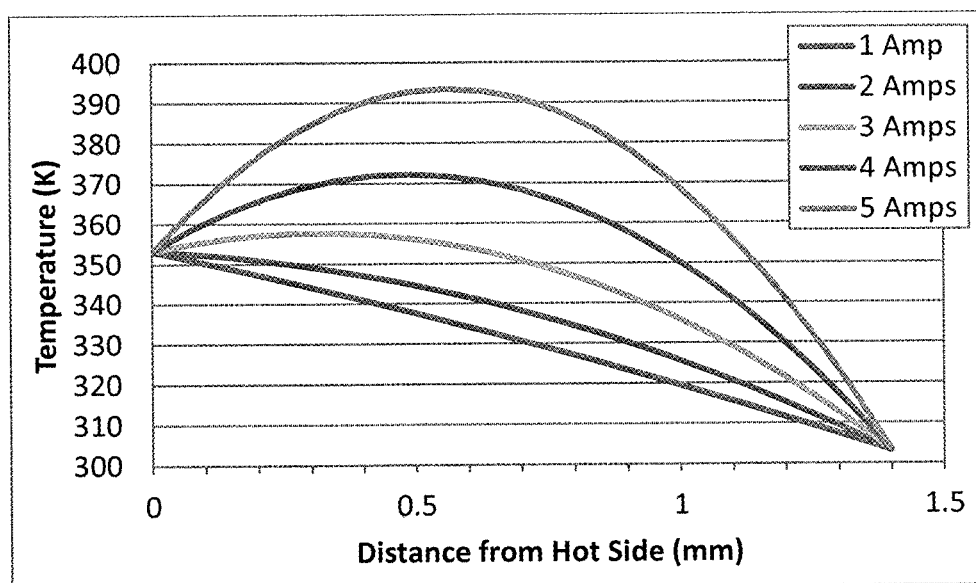
Figure 1. Temperature profiles through TE leg as a function of current

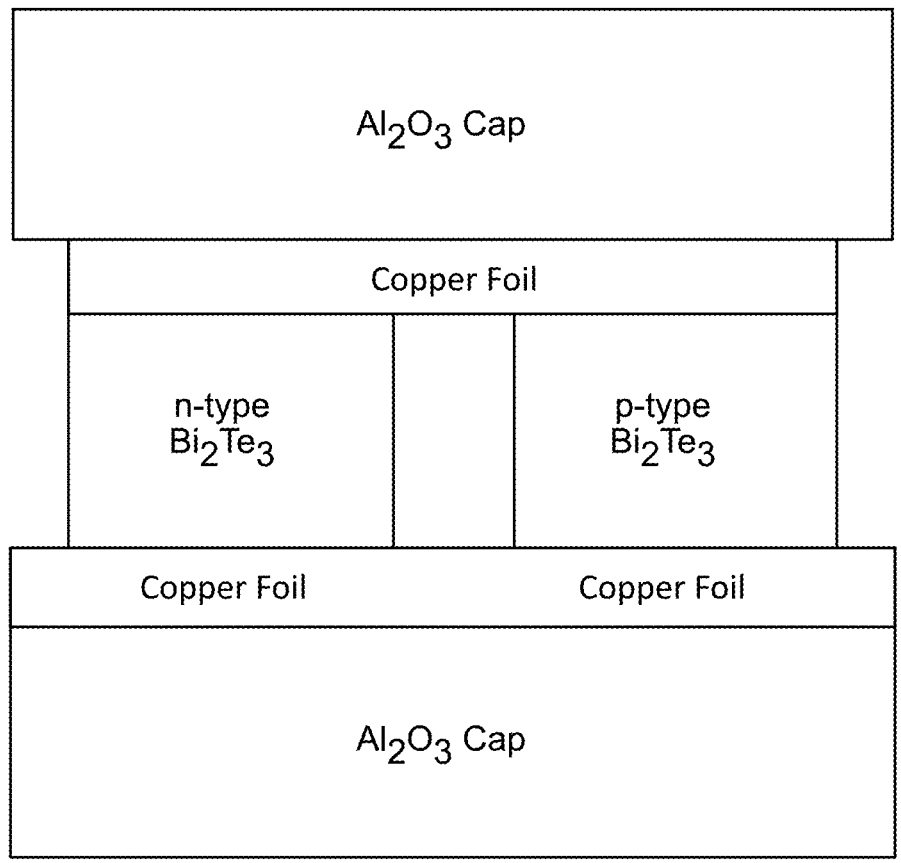
Figure 2. Conventional Thermoelectric Couple

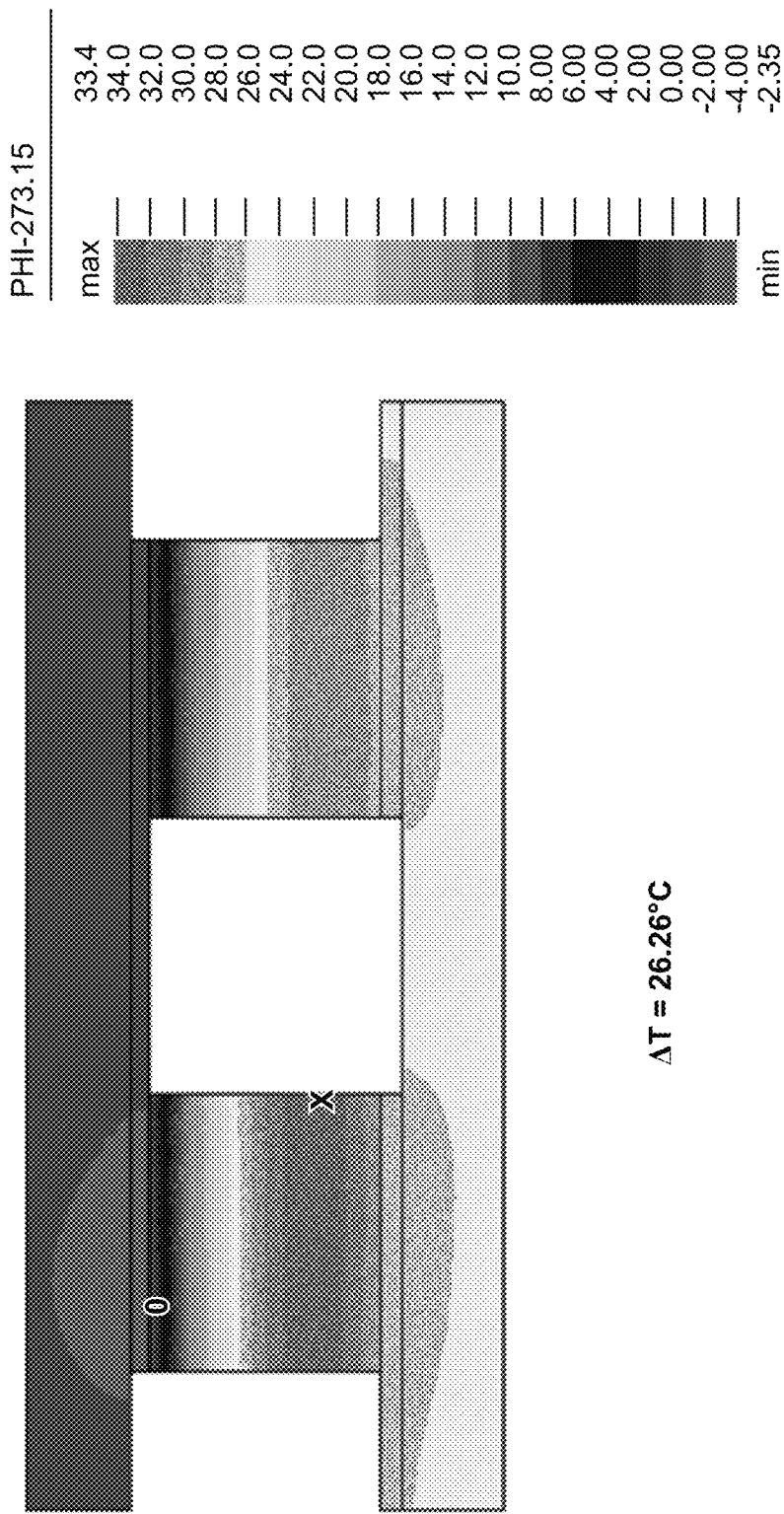
Figure 3. Temperature Fields in Conventional Thermoelectric Couple

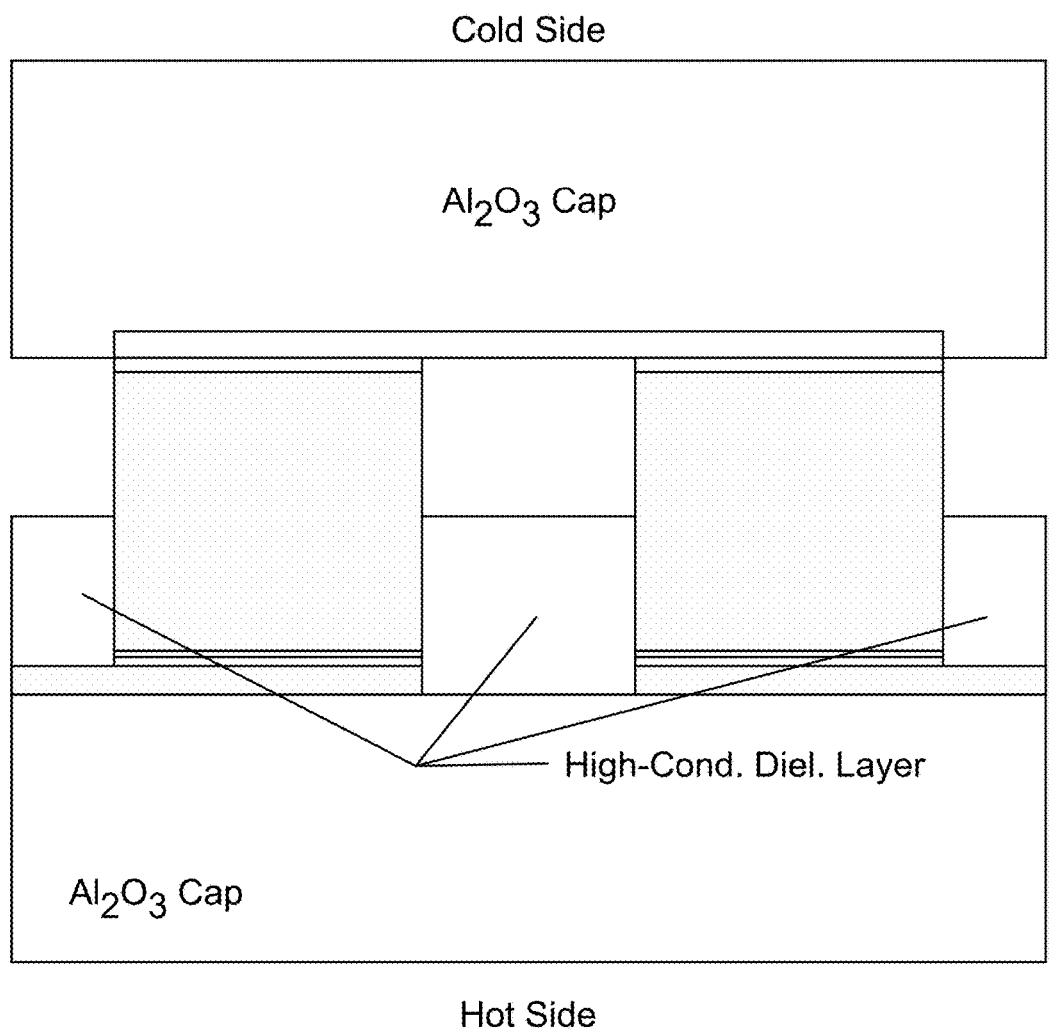
Figure 4. Modified Thermoelectric Couple of these teachings

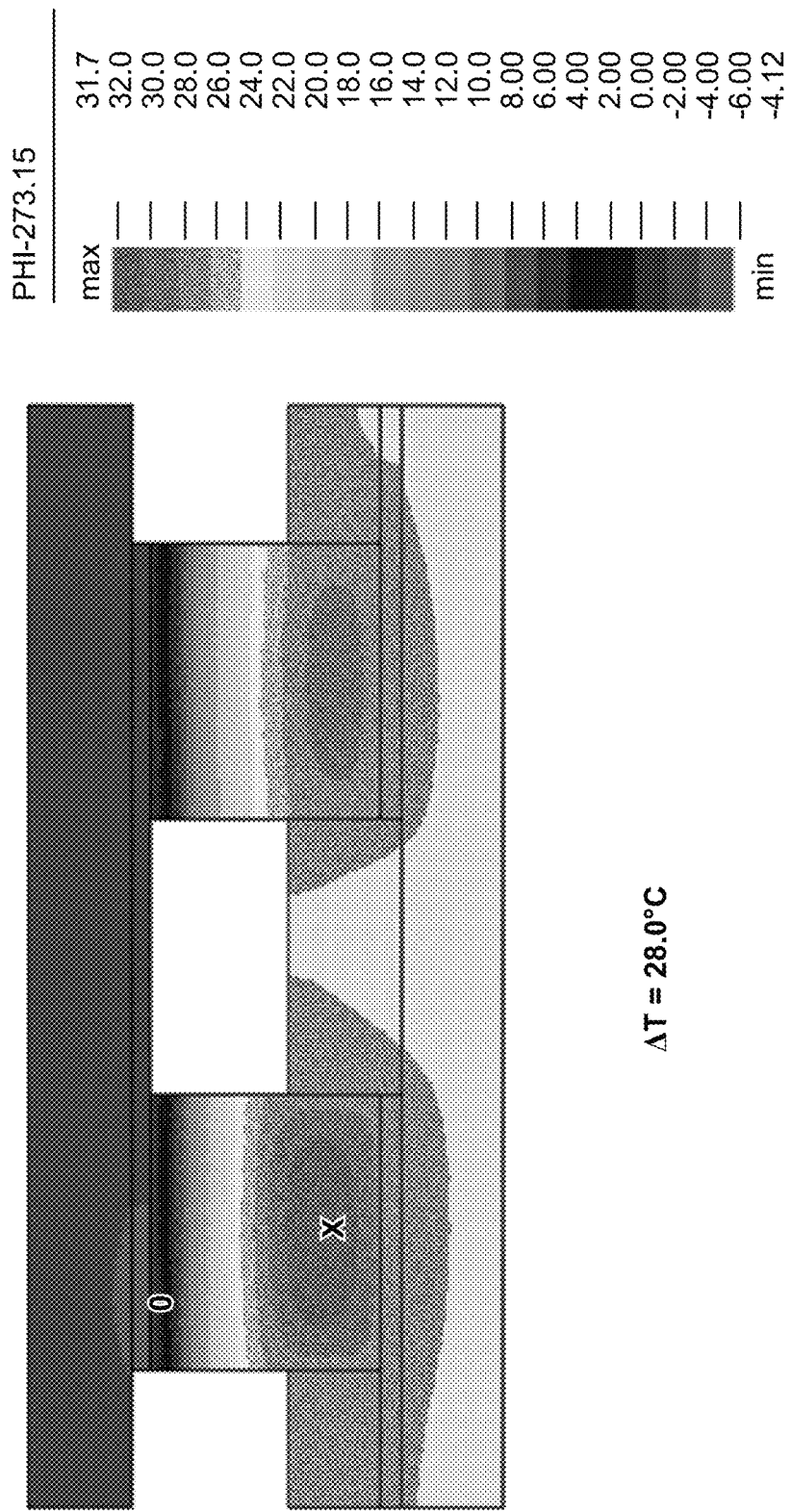
Figure 5. Temperature Fields in Modified Thermoelectric Couple of these teachings

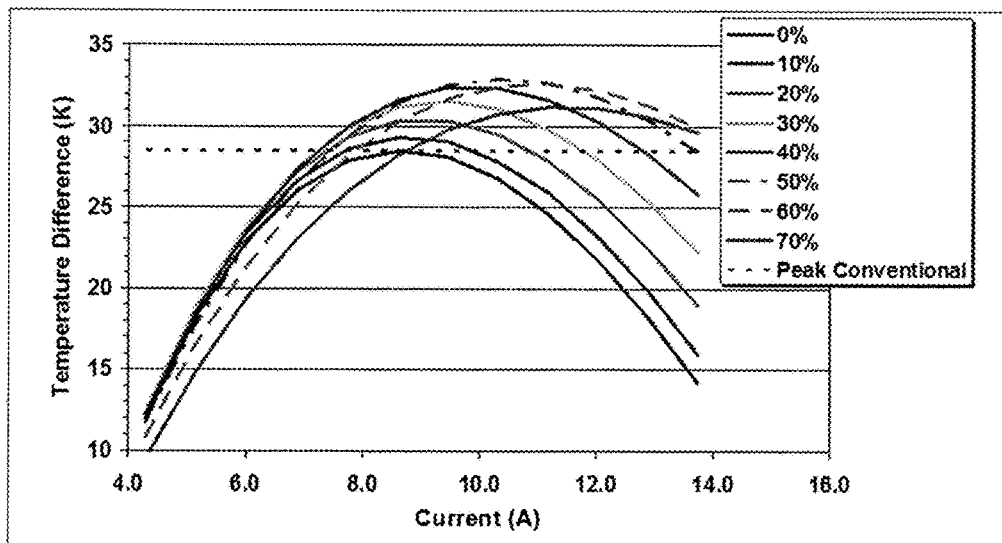
Figure 6. Temperature Differential Performance Curves for Conventional Thermoelectric Device Modified with Hot-Side Layer of Alumina

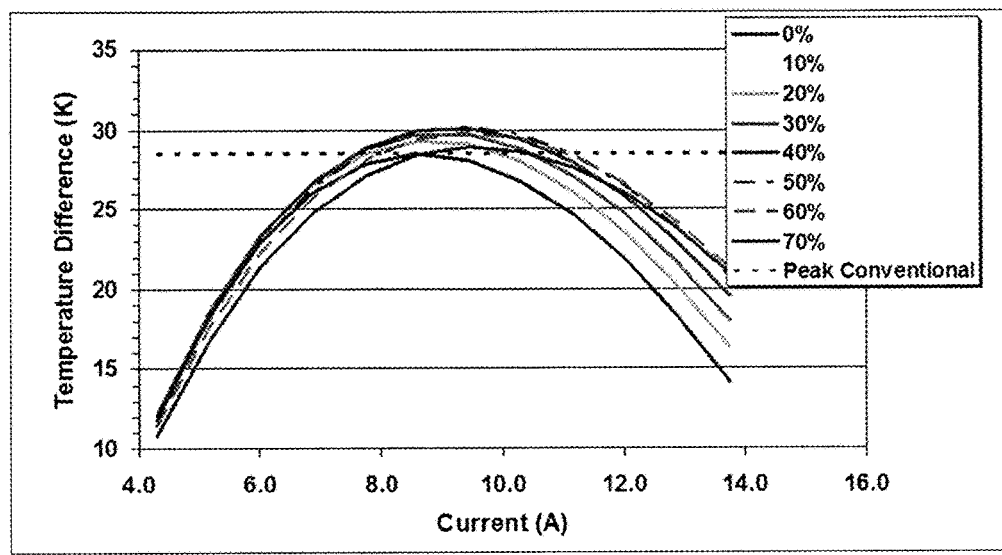
Figure 7. Temperature Differential Performance Curves for Conventional Thermoelectric Device Modified with Hot-Side Layer of Epoxy

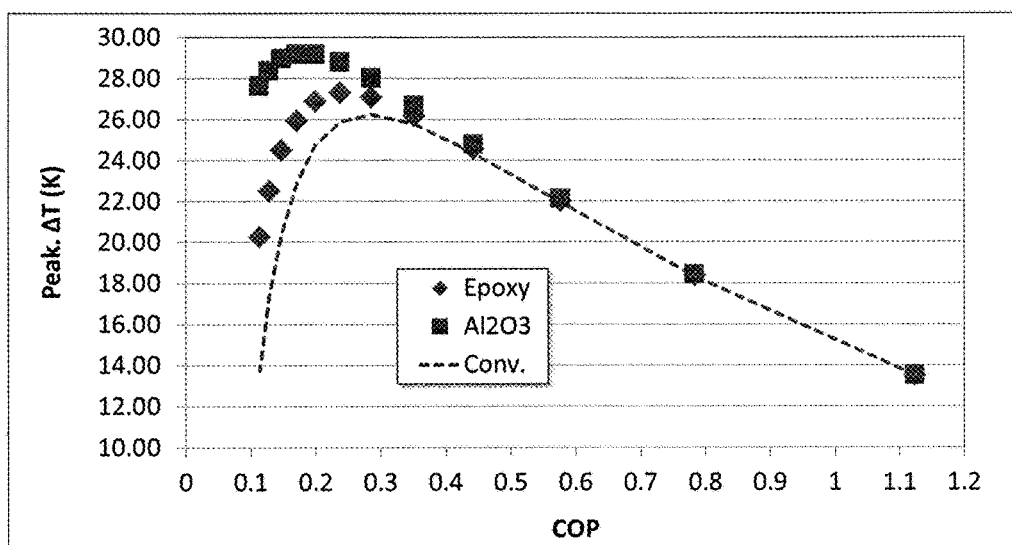
Figure 8. Peak ΔT vs. COP for Selected Dielectric Height

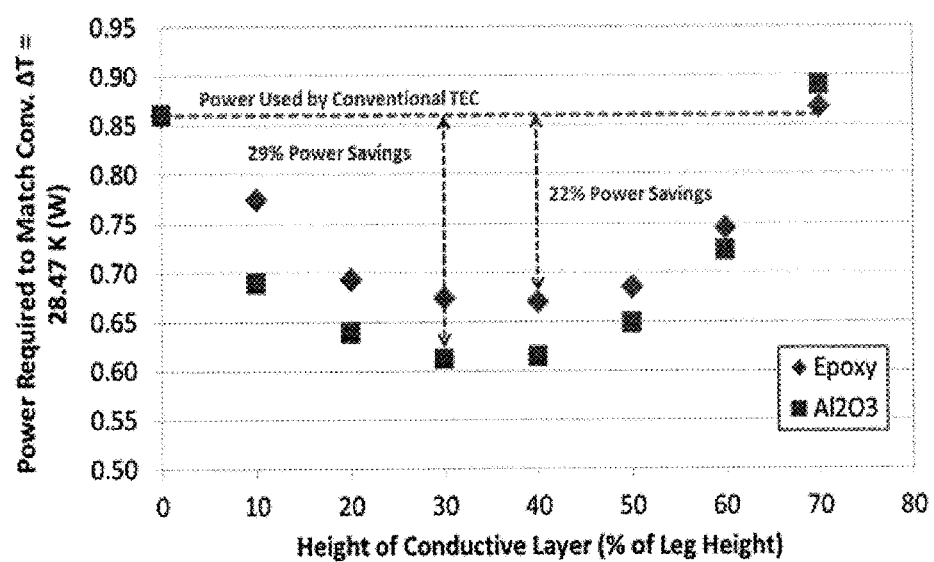
Fig. 9 Optimum Height of Dielectric Conductive Layer to Minimize Power Required to Achieve Same Temperature Differential as Conventional Thermoelectric Device

THERMOELECTRIC COOLERS WITH ASYMMETRIC CONDUCTANCE

CROSS REFERENCE TO RELATED APPLICATIONS

This application is a divisional of co-pending U.S. patent application Ser. No. 14/492,577, filed on Sep. 22, 2014, entitled THERMOELECTRIC COOLERS WITH ASYMMETRIC CONDUCTANCE, which in turn claims priority to and benefit of U.S. Provisional Application No. 61/881,244, filed on Sep. 23, 2013, the contents of which are incorporated by reference herein in their entirety for all purposes.

BACKGROUND

The present teachings relate to a method and system for creating a thermoelectric cooling device capable of transporting large heat loads across significant temperature differentials while maintaining a large coefficient of performance.

Thermoelectric coolers operate by the Peltier effect (which also goes by the more general name thermoelectric effect). The device has two sides, and when DC current flows through the device, it brings heat from one side to the other, so that one side gets cooler while the other gets hotter. The "hot" side is attached to a heat sink. Two unique semi-conductors, one n-type and one p-type, are placed thermally in parallel to each other and electrically in series and then joined with a thermally conducting/electrically insulating plate on each side to form a couple. When a voltage is applied to the free ends of the two semiconductors, there is a flow of DC current across the junction of the semi-conductors causing a temperature difference.

Thermoelectric coolers have long been noted for their compact construction, high reliability, and clean, quiet operation. Due to recent reductions in price and improvements in performance, thermoelectric refrigeration units are now found in consumer markets (coolers, refrigerators, etc.). Thermoelectric coolers (TECs), are, however, inefficient devices requiring large amounts of current to provide a refrigerant effect. Even modest improvements in performance would increase the market potential of thermoelectric cooling, expanding its role in commercial, military, and aerospace applications.

The limitations on refrigeration are due both to the available materials and to the inherent geometry of TEC devices. The cooling, of course, is provided via the Peltier effect, where the heat absorption by electrons as they jump to higher energy levels provides a cooling effect. At the opposite end of the Peltier material, the electrons return to a lower energy level, releasing energy and increasing the temperature at that location. Thus a temperature differential across the material is created. Unfortunately, since the Seebeck coefficients of existing materials are small, a large amount of current is required to create a significant refrigeration effect.

TEC elements within coolers are wired in series so that each junction sees the same current, which argues for designing the elements with short sections of material to reduce voltages and ohmic losses. Conduction from the hot end to the cold end of each leg is increased, however, as the leg is shortened, counteracting the energy absorption at the cold junction.

The ideal material for TEC coolers would have a high Seebeck coefficient, a low electrical resistance, and a low thermal conductivity. All currently-available materials suffer compromises among these three criteria. Since the ideal material does not yet exist (although there are ongoing efforts to significantly improve TEC materials), one must consider design solutions that circumvent material limitations and provide increased refrigeration performance.

In a conventional TEC cooler, depending on the current, the hottest point lies at the hot side or between the hot side and the midpoint of the legs. Typically, half of the ohmic heat generated will be absorbed at each junction of the leg, so increasing the thermal conduction from the midpoint to the hot side of the leg will also increase thermal conduction to the cold side of the leg, and no net benefit will result. In a conventional TEC cooler, ohmic loss causes temperature backflow to the cold side that limits the thermal transfer efficiency.

There is a need for TEC cooler designs with better thermal transfer efficiency.

SUMMARY

TEC cooler designs with better thermal transfer efficiency in which thermal conductance to the hot side cover plate is improved are disclosed herein below.

In one or more embodiments, the system of these teachings includes a hot side thermally-conducting, electrically-conducting cover plate with electrically conductive connectors on the inner surface, a cold side thermally-conducting, electrically-insulating cover plate with electrically conductive connectors on the inner surface, the hot side thermally conducting/electrically insulating cover plate being displaced away from the cold side thermally conducting/electrically insulating cover plate, one or more thermoelectric couples, each thermoelectric couple comprising a p-doped semiconductor element and an n-doped semiconductor element, each one of the p-doped semiconductor element and the n-doped semiconductor element being disposed between the hot side thermally conducting/electrically insulating cover plate and the cold side thermally conducting/electrically insulating cover plate, each one of the p-doped semiconductor element and the n-doped semiconductor element being thermally connected to the hot side thermally conducting/electrically insulating cover plate and the cold side thermally conducting/electrically insulating cover plate and electrically connected to each other via the electrically conductive cover plate connectors, and means for improving thermal conductance to the hot side thermally conducting/electrically insulating cover plate.

In one instance, the means for improving thermal conductance to the hot side thermally conducting/electrically insulating cover plate include a substantially thermally conductive/electrically insulating material disposed between the hot side thermally conducting/electrically insulating cover plate and the cold side thermally conducting, electrically insulating cover plate and on the hot side thermally conducting, electrically insulating cover plate, the substantially thermally conductive/electrically insulating material partially filling a volume between the hot side thermally conducting/electrically insulating cover plate and the cold side thermally cover plate, a height of the substantially thermally conductive/electrically insulating material being less than a distance between the hot side thermally conducting/electrically insulating cover plate and the cold side thermally conducting/electrically insulating cover plate.

In another instance, the means for improving thermal conductance to the hot side thermally conducting/electrically insulating cover plate include each one of the p-doped semiconductor element and the n-doped semiconductor element, wherein a cross-section of each one of the p-doped semiconductor element and the n-doped semiconductor element varies as a function of distance between the hot side thermally-conducting and electrically insulating cover plate and the cold side thermally conducting/electrically insulating and electrically insulating cover plate.

In yet another instance, the means for improving thermal conductance to the hot side thermally conducting/electrically insulating cover plate include each one of the p-doped semiconductor element and the n-doped semiconductor element, wherein a thermal conductivity of each one of the p-doped semiconductor element and the n-doped semiconductor element varies as a function of distance between the hot side thermally conducting/electrically insulating and electrically insulating cover plate and the cold side thermally insulating and electrically conducting cover plate.

In one or more embodiments, the method of these teachings includes improving thermal conductance to a hot side thermally conducting/electrically insulating cover plate in a thermoelectric cooler, wherein the thermoelectric cooler includes a hot side thermally conducting/electrically insulating cover plate with electrical connectors on the inner face, a cold side thermally conducting/electrically insulating cover plate with electrical connectors on the inner face, the hot side thermally conducting/electrically insulating cover plate being displaced away from the cold side thermally conducting/electrically insulating cover plate, one or more thermoelectric couples, each thermoelectric couple comprising a p-doped semiconductor element and an n-doped semiconductor element, each one of the p-doped semiconductor element and the n-doped semiconductor element being disposed between the hot side thermally conducting/electrically insulating cover plate and the cold side thermally cover plate, each one of the p-doped semiconductor element and the n-doped semiconductor element being thermally connected to the hot side thermally conducting/electrically insulating cover plate and the cold side thermally conducting/electrically insulating cover plate and electrically connected to each other via the electrical connectors on the inner faces of the hot side and cold side cover plates.

In one instance, improving the thermal conductance to a hot side thermally conducting cover plate in a thermoelectric cooler includes disposing a substantially thermally conductive/electrically insulating material between the hot side thermally conducting/electrically insulating cover plate and the cold side thermally conducting/electrically insulating cover plate and on the hot side thermally conducting/electrically insulating cover plate, the substantially thermally conductive/electrically insulating material partially filling a volume between the hot side thermally conducting/electrically insulating cover plate and the cold side thermally conducting/electrically insulating cover plate, a height of the substantially thermally conductive/electrically insulating material being less than a distance between the hot side thermally conducting/electrically insulating cover plate and the cold side thermally conducting/electrically insulating cover plate.

In another instance, improving the thermal conductance to a hot side thermally conducting/electrically insulating cover plate in a thermoelectric cooler includes tapering a cross-section of each one of the p-doped semiconductor element and the n-doped semiconductor element so that the cross-section varies as a function of distance between the hot side thermally conducting/electrically insulating cover plate and the cold side thermally cover plate.

In yet another instance, improving the thermal conductance to a hot side thermally conducting/electrically insulating cover plate in a thermoelectric cooler includes functionality grading material in each one of the p-doped semiconductor element and the n-doped semiconductor element in order to vary the thermal conductivity of each one of the p-doped semiconductor element and the n-doped semiconductor element as a function of distance between the hot side thermally conducting/electrically insulating cover plate and the cold side thermally conducting/electrically insulating cover plate.

A number of other embodiments of the method and system of these teachings are presented herein below.

For a better understanding of the present teachings, together with other and further needs thereof, reference is made to the accompanying drawings and detailed description and its scope will be pointed out in the appended claims.

DESCRIPTION OF THE DRAWINGS

FIG. 1 shows Temperature profiles through TE leg as a function of current.

FIG. 2 shows a conventional thermoelectric couple, with an alumina cover plate, copper electrical connectors, n- and p-type $Bi_2Te_3$ thermoelectric arranged so that current flows from the copper foil at the lower left to the copper foil at the lower right via the n-type material, the upper copper foil, and the p-type material. Heat is released at the lower $Bi_2Te_3$/Cu boundaries, and heat is absorbed at the upper $Bi_2Te_3$/Cu boundaries.

FIG. 3 shows typical computed temperature fields in the cooler: the highest temperature points are in the legs rather than at the hot side $Bi_2Te_3$/Cu junction.

FIG. 4 shows the FIG. 1 design modified with a dielectric layer that reduces the thermal resistance between the peak hot spot in the leg and the hot side heatsink.

FIG. 5 shows the computed temperature fields for the modified design for the same operating conditions as the analysis in FIG. 3. The peak temperature has been reduced and the refrigeration has been improved by increasing the cold-to-hot side temperature differential by 6.6%.

FIG. 6 shows Temperature Differential Performance Curves for Conventional Thermoelectric Device Modified, according to theses teachings, with Hot-Side Layer of Alumina.

FIG. 7 shows Temperature Differential Performance Curves for Conventional Thermoelectric Device Modified, according to theses teachings, with Hot-Side Layer of Epoxy.

FIG. 8 shows Peak ΔT vs. COP for Selected Thermally Conductive Dielectric Height.

FIG. 9 shows Optimum Height of Thermally Conductive Dielectric Layer to Minimize Power Required to Achieve Same Temperature Differential as Conventional Thermoelectric Device.

DETAILED DISCLOSURE

Figure 4A:
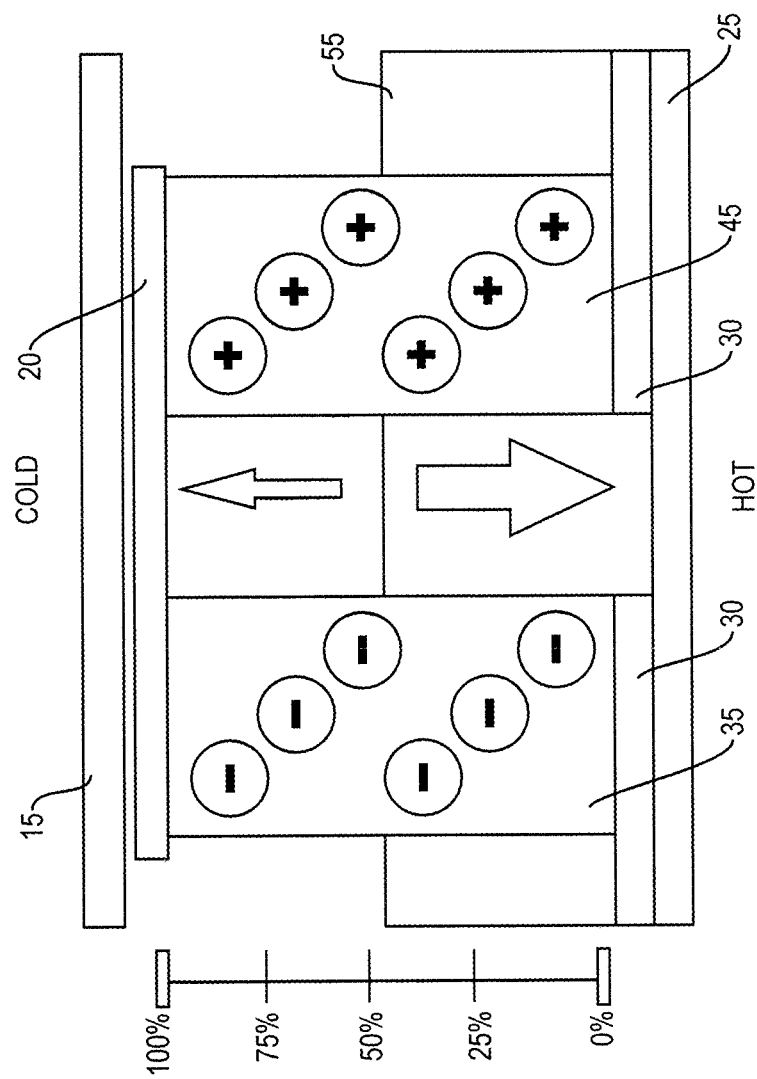
FIG. 4a shows an embodiment of the system of these teachings.

The following detailed description is not to be taken in a limiting sense, but is made merely for the purpose of illustrating the general principles of these teachings, since the scope of these teachings is best defined by the appended claims. Although the teachings have been described with respect to various embodiments, it should be realized these teachings are also capable of a wide variety of further and other embodiments within the spirit and scope of the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

In the following, the term "coefficient of performance" refers to the ratio of heat pumped by the device to the power input to the device. Thus, if a device were capable of pumping 10 W of heat from a low temperature to a high temperature reservoir, and it accomplished this using 5 W of input power, it would have a coefficient of performance (COP) of 2.

In one or more embodiments, the system of these teachings includes a hot side thermally conducting/electrically insulating cover plate with electrical connectors on the inner surface, a cold side thermally conducting/electrically conducting cover plate with electrical connectors on the inner surface, the hot side thermally conducting/electrically insulating cover plate being displaced away from the cold side thermally conducting/electrically insulating cover plate, one or more thermoelectric couples, each thermoelectric couple comprising a p-doped semiconductor element and an n-doped semiconductor element, each one of the p-doped semiconductor element and the n-doped semiconductor element being disposed between the hot side thermally conducting/electrically insulating cover plate and the cold side thermally conducting/electrically insulating cover plate, each one of the p-doped semiconductor element and the n-doped semiconductor element being thermally connected to the hot side thermally conducting/electrically insulating cover plate and the cold side thermally conducting/electrically insulating cover plate and electrically connected to each other, and means for improving thermal conductance to the hot side thermally conducting/electrically insulating cover plate.

In one instance, the means for improving thermal conductance to the hot side thermally conducting/electrically insulating cover plate include a substantially thermally conductive/electrically insulating material disposed between the hot side thermally conducting/electrically insulating cover plate and the cold side thermally conducting/electrically insulating cover plate and on the hot side thermally conducting/electrically insulating cover plate, the substantially thermally conductive/electrically insulating material partially filling a volume between the hot side thermally conducting/electrically insulating cover plate and the cold side thermally cover plate, a height of the substantially thermally conductive/electrically insulating material being less than a distance between the hot side thermally conducting/electrically insulating cover plate and the cold side thermally conducting/electrically insulating cover plate.

FIG. 4a shows an embodiment of the system of these teachings. Referring to FIG. 4a, in the embodiment shown there in, the TE (thermoelectric) cooler of these teachings includes a cold side thermally conducting/electrically insulating cover plate 15 and a hot side thermally conducting/ electrically insulating cover plate 25 displaced from each other. An n-doped semiconductor element 35 and a p-doped semiconductor element 45 are disposed between the cold side thermally conducting/electrically insulating cover plate 15 and the hot side thermally conducting/electrically insulating cover plate 25. Each of the semiconductor elements 35, 45 are thermally connected to each of the thermally conducting/electrically insulating cover plates 15, 25 and electrically connected to each other. Electrical connector(s) 30 is disposed on the hot side thermally conducting/electrically insulating cover plate 25 and electrical connector 20 is disposed on the cold side thermally conductive cover plate. A substantially thermally conductive/electrically insulating material 55 partially fills the volume between the cold side thermally conducting/electrically insulating cover plate 15 and the hot side thermally conducting/electrically insulating cover plate 25 and is disposed on and in thermal contact with the hot side thermally conducting/electrically insulating corporate 25. In the embodiment shown in FIG. 4a, a height of the thermally conductive/electrically insulating material 55 is about 40% of the height of the semiconductor elements 35, 45. It should be noted that embodiments including multistage thermoelectric coolers, where at least one stage includes a substantially thermally conductive/electrically insulating material partially filling the volume between the thermally conducting/electrically insulating cover plates, are within the scope of these teachings.

In one instance, the thermally conductive/electrically insulating material 55 is a ceramic, plastic, epoxy, or organic material. In another instance, the thermally conductive/ electrically insulating material 55 is comprised of several layers and/or is functionally graded to obtain predetermined operating characteristics, including temperature differential, heat transport, or coefficient of performance or to optimize such operating characteristics. In another instance, the height of the thermally conductive/electrically insulating material 55 is selected in order to obtain predetermined operating characteristics, including temperature differential, heat transport, or coefficient of performance or to optimize such operating characteristics ("height of the thermally conductive/electrically insulating material," as used herein, refers to height measurement starting from a point closest to the hot side thermally conducting/electrically insulating cover plate and moving towards the cold side thermally conducting/electrically insulating cover plate). In yet another instance, the thermally conductive/electrically insulating material 55 and the dimensions of the thermally conductive/electrically insulating material 55 are determined in order to obtain predetermined mechanical strength. In another instance, the method used to increase the conductance toward the hot side may be tailored independently for the p- and n-elements based on their properties.

The semi-conducting elements 35, 45 are selected from existing or advanced thermoelectric materials including, but not limited to, $Bi_2Te_3$, Bi2Se3, PbTe, SiGe, inorganic clathrates, magnesium group IV compounds, skudderites, oxides, electrically conducting organic materials, functionally graded materials, and nanomaterials.

In one embodiment, the thermally conductive/electrically insulating material 55, the hot side thermally conducting/ electrically insulating cover plate 25 (and any needed electrical/thermal connection material) are all fabricated or assembled as a single unit.

In order to facilitate the understanding of these teachings, although we do not desire to be bound by theory, the following information is presented.

For a given couple design (a couple is a P- and N-doped material pair) operating at elevated currents, these ohmic losses within the material result in a parabolic temperature profile within each leg. The equation for the temperature profile for a TE couple with fixed hot- and cold-side temperatures, identical and constant properties, and cross-sections for the n- and p-legs is provided by Kraus & Bar-Cohen "Thermal Analysis and Control of Electronic Equipment," McGraw-Hill (1983):

$$T(x) = T_0 - \left(\frac{T_0 - T_L}{L} - \frac{\rho I^2 L}{2kA_x^2}\right)x - \left(\frac{\rho I^2}{2kA_x^2}\right)x^2 \quad (1)$$

where T is the temperature, x is the distance along the leg from the hot side to the cold side, L is the length of the legs, $\rho$ is the electrical resistivity of the TE material, k is the thermal conductivity, and $A_x$ is the cross-sectional area of the legs.

As can be seen from the equation, the parabolic nature of the temperature profile becomes more pronounced as the current is increased, indicating that the point of maximum temperature moves from the hot side of the leg to the interior.

The current at which the interior temperature exceeds the hot side temperature is computed by evaluating dT(x)/dx>0 at x=0. This provides a criterion for the current threshold:

$$I > \sqrt{\frac{2kA_x^2}{\rho L} \frac{(T_0 - T_L)}{L}} \quad (2)$$

In this current domain the maximum temperature will be found in the interior of the leg. The location of the maximum temperature can be calculated by taking the derivative of (1) with respect to x and setting it to zero, resulting in:

$$x_{max} = \left(\frac{T_0 - T_L}{L}\right)\left(\frac{kA_x^2}{\rho I^2}\right) - \frac{L}{2} \quad (3)$$

As the current becomes very large, the first term in (3) vanishes, and the maximum temperature point can be found at the center plane of the leg. This effect can be seen in FIG. 1, which shows the temperature distributions through a 1.4 mm-thick thermoelectric for 5 current levels. At the lowest current the hot spot is at the hot junction and the temperature distribution is nearly linear. As the current increases, the temperature distribution develops a peak that moves toward the midpoint of the leg.

In the current domain described by Equation (2), the hottest point lies between the hot side and the midpoint of the legs (per Equation (3)). Again assuming constant properties and constant area of the legs, half of the ohmic heat generated will be absorbed at each junction of the leg, so increasing the thermal conduction from the midpoint to the hot side of the leg will also increase thermal conduction to the cold side of the leg, and no net benefit will result.

If, however, the thermal conductance between the peak temperature spot and the hot side is increased while the thermal conductance between the peak temperature spot and the cold side is unchanged, then the ohmic heat will be preferentially transferred to the hot side, reducing the ohmic heat load at the cold junction and thus improving refrigeration performance.

Increasing the thermal conductance also increases the net heat conduction from the hot side to the cold side, penalizing performance, but this becomes less significant in the domain of mid-to-high currents where ohmic heating has a much larger contribution to the cold junction energy balance.

The conductance between the peak temperature location and the hot side of the TE couple can be increased in a number of ways, including but not limited to, one or more of introducing a thermal conductive/electrically insulating material to fill the voids between legs; modifying the leg geometry with a variable cross-section as a function of distance along the leg; and/or using functionally graded TE materials with varying thermal conductivity. In cases where transient or pulsed cooling is used, a phase change material might be used to fill the voids. All of these methods would have appropriate regions of implementation roughly corresponding to the volume between the peak temperature point and the hot side of the TE couple.

Improving the thermal conductance between the peak temperature location and the hot side of the TE couple by introducing a thermal conductive/electrically insulating material to fill the voids between legs has been disclosed hereinabove.

Figures 10A, 10B:
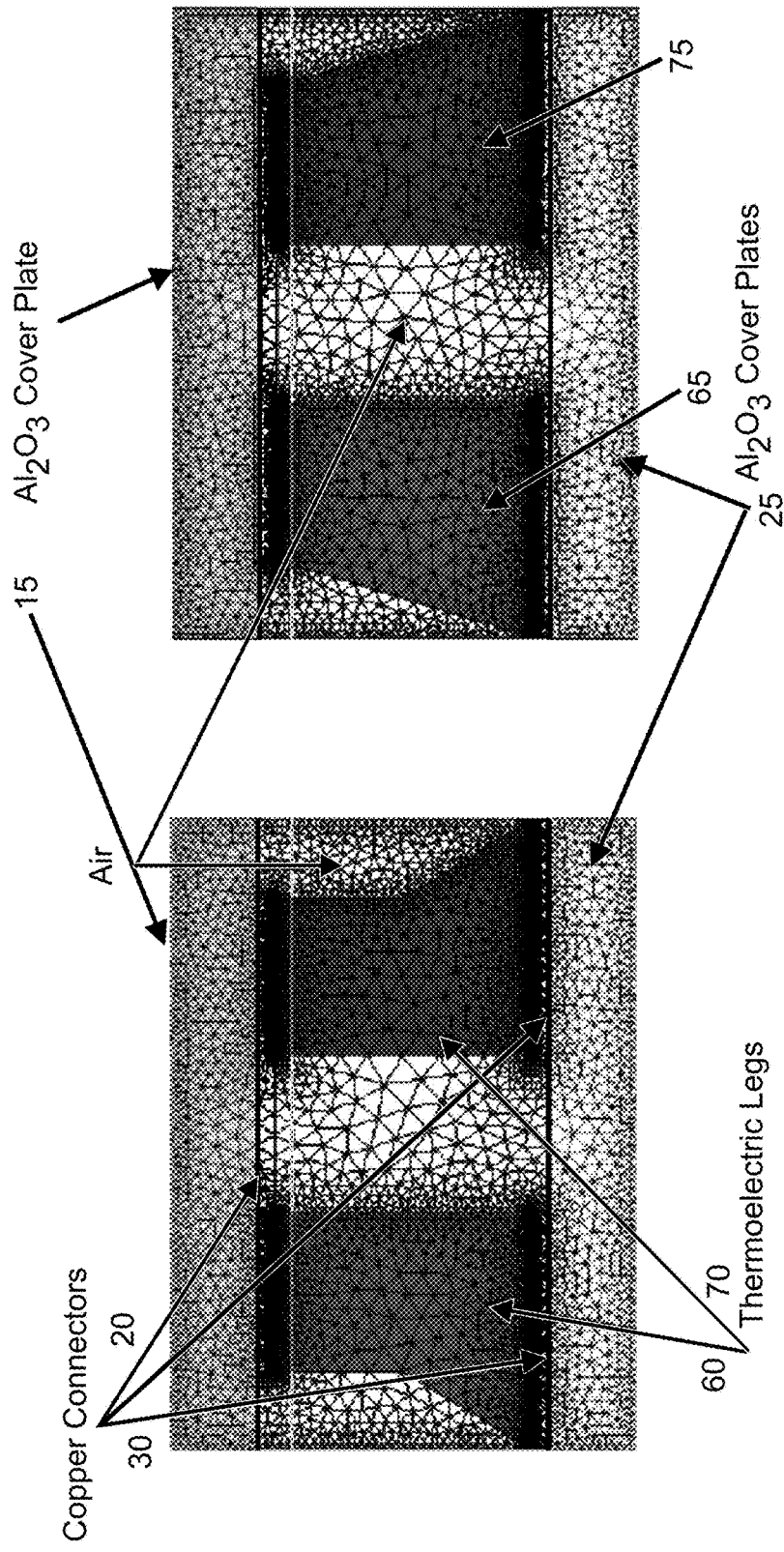
FIGS. 10a and 10b show a design modified so that a width of a cross-section of the thermoelectric semiconductor elements varies in order to reduce the thermal resistance between the peak hot spot in the leg and the hot side heatsink.

In another instance, the means for improving thermal conductance to the hot side thermally conducting/electrically insulating cover plate include each one of the p-doped semiconductor element and the n-doped semiconductor element, wherein a cross-section of each one of the p-doped semiconductor element and the n-doped semiconductor element varies as a function of distance between the hot side thermally and electrically conducting cover plates and the cold side thermally and electrically cover plates. Exemplary embodiments are shown in FIGS. 10a and 10b. In the exemplary embodiment shown in FIGS. 10a and 10b, the width of the cross-section of each one of the p-doped semiconductor element and the n-doped semiconductor element is larger at the hot side than at the cold side.

In yet another instance, the means for improving thermal conductance to the hot side thermally conducting/electrically insulating cover plate include each one of the p-doped semiconductor element and the n-doped semiconductor element, wherein a thermal conductivity of each one of the p-doped semiconductor element and the n-doped semiconductor element varies as a function of distance between the hot side thermally and electrically conducting cover plate and the cold side thermally and electrically cover plate.

In one or more embodiments, the method of these teachings includes improving thermal conductance to a hot side thermally conducting/electrically insulating cover plate in a thermoelectric cooler, wherein the thermoelectric cooler includes a hot side thermally conducting/electrically insulating cover plate with electrical connectors on the inner surface, a cold side thermally conducting/electrically insulating cover plate with electrical connectors on the inner surface, the hot side thermally conducting/electrically insulating cover plate being displaced away from the cold side thermally conducting/electrically insulating cover plate, one or more thermoelectric couples, each thermoelectric couple comprising a p-doped semiconductor element and an n-doped semiconductor element, each one of the p-doped semiconductor element and the n-doped semiconductor element being disposed between the hot side thermally conducting/electrically insulating cover plate and the cold side thermally conducting/electrically insulating cover plate, each one of the p-doped semiconductor element and the n-doped semiconductor element being thermally connected to the hot side thermally conducting/electrically insulating cover plate and the cold side thermally conducting/electrically insulating cover plate and electrically connected to each other via the electrical connectors on the inner surface of the cover plates.

In one instance, improving the thermal conductance to a hot side thermally conducting/electrically insulating cover plate in a thermoelectric cooler includes disposing a substantially thermally conductive/electrically insulating material between the hot side thermally conducting/electrically insulating cover plate and the cold side thermally conducting/electrically insulating cover plate and on the hot side thermally conducting/electrically insulating cover plate, the substantially thermally conductive/electrically insulating material partially filling a volume between the hot side thermally conducting/electrically insulating cover plate and the cold side thermally cover plate, a height of the substantially thermally conductive/electrically insulating material being less than a distance between the hot side thermally conducting/electrically insulating cover plate and the cold side thermally conducting/electrically insulating cover plate.

Adding a layer of thermally conductive dielectric material (hereinafter referred to as dielectric) to the hot side of the interior of a conventional TE cooler design is a means of increasing the TE leg conductance on the hot side. This approach is amenable to retrofitting existing TE coolers, as well as being built as an integral part of new coolers by incorporating the material during fabrication or by partially embedding the elements in the hot side thermally conducting/electrically insulating cover plate. It also increases the shear strength of the cooler by adding support to the legs. Thus, one embodiment of the method of these teachings is to introduce a dielectric material of optimal thickness around the hot side of the legs of the TE couples, noting that the optimal thickness may vary for the p-doped and n-doped elements.

In another instance, improving the thermal conductance to a hot side thermally conducting/electrically insulating cover plate in a thermoelectric cooler includes tapering a cross-section of each one of the p-doped semiconductor element and the n-doped semiconductor element so that the cross-section varies as a function of distance between the hot side thermally and electrically conducting cover plate and the cold side thermally and electrically cover plate, noting that the tapers may vary for the p-doped and n-doped elements.

In yet another instance, improving the thermal conductance to a hot side thermally conducting/electrically insulating cover plate in a thermoelectric cooler includes functionality grading material in each one of the p-doped semiconductor element and the n-doped semiconductor element in order to vary the thermal conductivity of each one of the p-doped semiconductor element and the n-doped semiconductor element as a function of distance between the hot side thermally and electrically conducting cover plate and the cold side thermally and electrically cover plate.

In order to elucidate the present teachings, an exemplary embodiment is presented herein below. It should be noted that these teachings are not limited only to this exemplary embodiment.

Taking a typical commercial thermoelectric cooler design based on $Bi_2Te_3$ legs with dimensions of 1.4 mm×1.4 mm×1.14 mm as a baseline, one means of identifying the optimum dielectric material height is to use 2D and 3D finite element analyses with coupled electrical and thermal solutions.

For comparison, FIG. 2 shows a conventional thermoelectric couple, with an alumina cover plate, copper connectors, n- and p-type $Bi_2Te_3$ thermoelectric arranged so that current flows from the copper foil at the lower left to the copper foil at the lower right via the n-type material, the upper copper foil, and the p-type material. Heat is released at the lower $Bi_2Te_3$/Cu boundaries, and heat is absorbed at the upper $Bi_2Te_3$/Cu boundaries.

FIG. 3 shows typical computed temperature fields in the conventional thermoelectric cooler: the highest temperature points are in the legs rather than at the hot side $Bi_2Te_3$/Cu junction.

FIG. 4 shows the FIG. 2 design modified according to these teachings with a dielectric layer that reduces the thermal resistance between the peak hot spot in the leg and the hot side heatsink. FIG. 5 shows the computed temperature fields for the modified design for the same operating conditions as the analysis in FIG. 3. The peak temperature has been reduced and the refrigeration has been improved by increasing the cold-to-hot side temperature differential by 6.6%.

The cooler performance can be optimized per one of three performance criteria: 1) temperature differential; 2) heat load; or 3) coefficient of performance. The optimal geometry will differ depending upon which criterion or combination of criteria serve(s) as the design goal.

In this example the heat load is fixed and the interaction between COP and temperature differential is examined. FIG. 6 shows Temperature Differential Performance Curves for Conventional Thermoelectric Device Modified, according to these teachings, with Hot-Side Layer of Alumina. FIG. 7 shows Temperature Differential Performance Curves for Conventional Thermoelectric Device Modified, according to these teachings, with Hot-Side Layer of Epoxy. The performance curves in FIGS. 6 and 7 show the cold-to-hot temperature differentials achievable for a 1 W/cm$^2$ heat load over a range of currents. The alumina filler curves shown in FIG. 6 have better performance than the epoxy filler curves in FIG. 7 due to the alumina's higher thermal conductivity. Epoxy and alumina are good filler candidates due to their low cost.

For a given heat load, the optimum design point can be determined from plots such as the FIGS. 6 and 7 curves, depending on which performance characteristic is emphasized.

FIG. 8 shows a plot of the temperature differential vs. coefficient of performance (COP, heat load divided by device input power), for a selected height of the dielectric, derived from the FIGS. 6 and 7 results. FIG. 8 shows a graphical representation of COP vs. Delta T for the dielectric layer height that results in a substantially highest temperature differential at a given COP. The height of the dielectric is varying for different points in the epoxy and alumina curves.

FIG. 9 shows optimum height of dielectric layer to minimize power required to achieve same temperature differential as conventional thermoelectric device.

One can maximize temperature differential regardless of COP, maximize temperature differential for a given COP, or maximize COP for a given temperature differential. FIGS. 8 and 9 are examples of how the height of the thermally conductive/electrically insulating material can be selected in order to obtain predetermined operating characteristics, including temperature differential, heat transport, or coefficient of performance or to optimize such operating characteristics.

FIGS. 10a and 10b show a design modified so that a width of a cross-section of the thermoelectric semiconductor elements varies in order to reduce the thermal resistance between the peak hot spot in the leg and the hot side heatsink. Referring to FIGS. 10a and 10b, in the embodiment shown there in, the cross-sectional area of the thermoelectric elements 60, 70 (FIG. 10a), 65, 75 (FIG. 10b) varies with distance from the hot side thermally conducting/electrically insulating cover plate 25 ("cross-sectional area," as used herein, is refers to the cross-sectional area in a plane substantially perpendicular to a line extending from the hot side thermally conducting/electrically insulating cover plate to the cold side thermally conducting/electrically insulating cover plate, the line being substantially perpendicular to the hot side thermally conducting/electrically insulating cover plate). The copper connectors 20, 30 electrically connecting the n-doped thermoelectric element 60, 65 and the p-doped thermoelectric element 70, 75 are also shown in FIGS. 10a and 10b. In the embodiment shown in FIGS. 10a and 10b, the cross-sectional area of the thermoelectric elements is largest and the point closest to the hot side thermally conducting/electrically insulating cover plate 35 and decreases with distance away from the hot side thermally conducting/electrically insulating cover plate 35 ("distance away," as used herein, refers to distance measured from the hot side thermally conducting/electrically insulating cover plate and towards the cold side thermally conducting/electrically insulating cover plate). Other embodiments are also within the scope of these teachings. It should be noted that embodiments that combine the features shown in FIGS. 10a and 10b with the embodiment shown in FIG. 4a are also within the scope of these teachings.

The practitioner will appreciate that there are a variety of alternate materials which could be used in device construction, including: plastic, ceramic, and other non-electrically conductive materials to serve as fillers; various thermoelectric materials such as PbTe, SiGe, and new materials under development; and ceramics such as beryllia, aluminum nitride, and silicon carbide to serve as cover plates.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although these teachings have been described with respect to various embodiments, it should be realized these teachings are also capable of a wide variety of further and other embodiments that fall within the scope and spirit of the invention and the following claims.

The invention claimed is:

1. A thermoelectric cooler comprising:
    a hot side thermally conducting/electrically insulating cover plate;
    a cold side thermally conducting/electrically insulating cover plate, the cold side thermally conducting/electrically insulating cover plate being displaced away from the hot side thermally conducting/electrically insulating cover plate; and
    one or more thermoelectric couples, each one of the one or more thermoelectric couples comprising a p-doped semiconductor element and an n-doped semiconductor element; each one of the p-doped semiconductor element and the n-doped semiconductor element being disposed between the hot side thermally conducting/electrically insulating cover plate and the cold side thermally conducting/electrically insulating cover plate; said each one of the p-doped semiconductor element and the n-doped semiconductor element being thermally connected to the hot side thermally conducting/electrically insulating cover plate and the cold side thermally conducting/electrically insulating cover plate; first electrical connectors being disposed between the hot side thermally conducting/electrically insulating cover plate and the one or more thermoelectric couples and electrically operatively connected to the one or more thermoelectric couples; second electrical connectors being disposed between the cold side thermally conducting/electrically insulating cover plate and the one or more thermoelectric couples and electrically operatively connected to the one or more thermoelectric couples; said each one of the p-doped semiconductor element and the n-doped semiconductor element being electrically connected to each other via the first and second electrical connectors;
    wherein a cross-sectional area of each of the p-doped semiconductor element and the n-doped semiconductor element varying as a function of distance between the hot side thermally conducting/electrically insulating cover plate and the cold side thermally conducting/electrical insulating cover plate.

2. The thermoelectric cooler of claim 1 wherein the cross-sectional area of said each of the p-doped semiconductor element and the n-doped semiconductor element decreases as a function of distance away from the hot side thermally conducting/electrically insulating cover plate.

3. A thermoelectric cooler comprising:
    a hot side thermally conducting/electrically insulating cover plate;
    a cold side thermally conducting/electrically insulating cover plate, the cold side thermally conducting/electrically insulating cover plate being displaced away from the hot side thermally conducting/electrically insulating cover plate;
    one or more thermoelectric couples, each one of the one or more thermoelectric couples comprising a p-doped semiconductor element and an n-doped semiconductor element; each one of the p-doped semiconductor element and the n-doped semiconductor element being disposed between the hot side thermally conducting/electrically insulating cover plate and the cold side thermally conducting/electrically insulating cover plate; said each one of the p-doped semiconductor element and the n-doped semiconductor element being thermally connected to the hot side thermally conducting/electrically insulating cover plate and the cold side thermally conducting/electrically insulating cover plate; first electrical connectors being disposed between the hot side thermally conducting/electrically insulating cover plate and the one or more thermoelectric couples and electrically operatively connected to the one or more thermoelectric couples; second electrical connectors being disposed between the cold side thermally conducting/electrically insulating cover plate and the one or more thermoelectric couples and electrically operatively connected to the one or more thermoelectric couples; said each one of the p-doped semiconductor element and the n-doped semiconductor element being electrically connected to each other via the first and second electrical connectors; and
    means for improving thermal conductance to the hot side thermally conducting/electrically insulating cover plate.

4. The thermoelectric cooler of claim 3 wherein the means for improving thermal conductance to the hot side thermally conducting/electrically insulating cover plate comprise said each one of the p-doped semiconductor element and the n-doped semiconductor element, wherein a cross-sectional area of said each one of the p-doped semiconductor element and the n-doped semiconductor element varies as a function of distance between the hot side thermally conducting/ electrically insulating cover plate and the cold side thermally conducting/electrically insulating cover plate.

5. The thermoelectric cooler of claim 4 wherein the cross-sectional area of the each one of the p-doped semiconductor element and the n-doped semiconductor element decreases as a function of distance away from the hot side thermally conducting/electrically insulating cover plate.

6. The thermoelectric cooler of claim 3 wherein the means for improving the thermal conductance to a hot side thermally conducting/electrically insulating cover plate comprise said each one of the p-doped semiconductor element and the n-doped semiconductor element, wherein thermal conductivity of said each one of the p-doped semiconductor element and the n-doped semiconductor element varies as a function of distance between the hot side thermally conducting/electrically insulating cover plate and the cold side thermally conducting/electrically insulating cover plate.

\* \* \* \* \*